(12) United States Patent
Zhang (10) Patent No.: US 9,502,355 B2
(45) Date of Patent: Nov. 22, 2016

(54) BOTTOM PACKAGE HAVING ROUTING PATHS CONNECTED TO TOP PACKAGE AND METHOD OF MANUFACTURING THE SAME

(71) Applicant: NVIDIA Corporation, Santa Clara, CA (US)

(72) Inventor: Leilei Zhang, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 38 days.

(21) Appl. No.: 14/191,317

(22) Filed: Feb. 26, 2014

(65) Prior Publication Data
US 2015/0243610 A1 Aug. 27, 2015

(51) Int. Cl.
| H01L 23/538 | (2006.01) |
| H01L 21/56 | (2006.01) |
| H01L 21/50 | (2006.01) |
| H01L 25/065 | (2006.01) |
| H01L 25/10 | (2006.01) |
| H01L 25/00 | (2006.01) |
| H01L 23/498 | (2006.01) |
| H01L 23/00 | (2006.01) |

(52) U.S. Cl.
CPC ........... *H01L 23/5389* (2013.01); *H01L 21/50* (2013.01); *H01L 21/56* (2013.01); *H01L 23/49811* (2013.01); *H01L 25/0652* (2013.01); *H01L 25/0655* (2013.01); *H01L 25/105* (2013.01); *H01L 25/50* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/131* (2013.01); *H01L 2224/16145* (2013.01); *H01L 2224/16227* (2013.01); *H01L 2224/16235* (2013.01); *H01L 2224/32225* (2013.01); *H01L 2224/73204* (2013.01); *H01L 2224/81903* (2013.01); *H01L 2224/83101* (2013.01); *H01L 2224/83851* (2013.01); *H01L 2225/06513* (2013.01); *H01L 2225/06517* (2013.01); *H01L 2225/1023* (2013.01); *H01L 2225/1041* (2013.01); *H01L 2225/1058* (2013.01); *H01L 2924/12041* (2013.01); *H01L 2924/12042* (2013.01); *H01L 2924/15311* (2013.01); *H01L 2924/15331* (2013.01)

(58) Field of Classification Search
None
See application file for complete search history.

(56) References Cited

U.S. PATENT DOCUMENTS

| 6,268,662 | B1 * | 7/2001 | Test | H01L 21/563 257/773 |
| 2002/0015292 | A1 * | 2/2002 | Pritchett | H01L 25/18 361/780 |
| 2009/0309212 | A1 * | 12/2009 | Shim et al. | 257/700 |
| 2010/0140779 | A1 * | 6/2010 | Lin et al. | 257/690 |
| 2011/0291293 | A1 * | 12/2011 | Tuominen | H05K 1/0271 257/774 |
| 2014/0353819 | A1 * | 12/2014 | Chuang | H01L 23/49568 257/737 |
| 2015/0108635 | A1 * | 4/2015 | Liang | H01L 28/10 257/737 |
| 2015/0187709 | A1 * | 7/2015 | Lee | H01L 23/62 257/529 |

* cited by examiner

*Primary Examiner* — Michael Jung
(74) *Attorney, Agent, or Firm* — Zilka-Kotab, PC (57) ABSTRACT

A system, method, and computer program product are provided for producing a high bandwidth bottom package of a die-on-package structure. The method includes the steps of receiving a bottom package comprising a substrate material having a top layer and an integrated circuit die that is coupled to the top layer of the substrate material. A first set of pads is formed on the top layer of the substrate material and a layer of dielectric material is applied on a top surface of the bottom package to cover the integrated circuit die and the first set of pads.

29 Claims, 10 Drawing Sheets

BOTTOM PACKAGE HAVING ROUTING PATHS CONNECTED TO TOP PACKAGE AND METHOD OF MANUFACTURING THE SAME

FIELD OF THE INVENTION

The present invention relates to an integrated circuit package, and more particularly to a bottom package of a die-on-package (DoP) structure.

BACKGROUND

Figure 1:
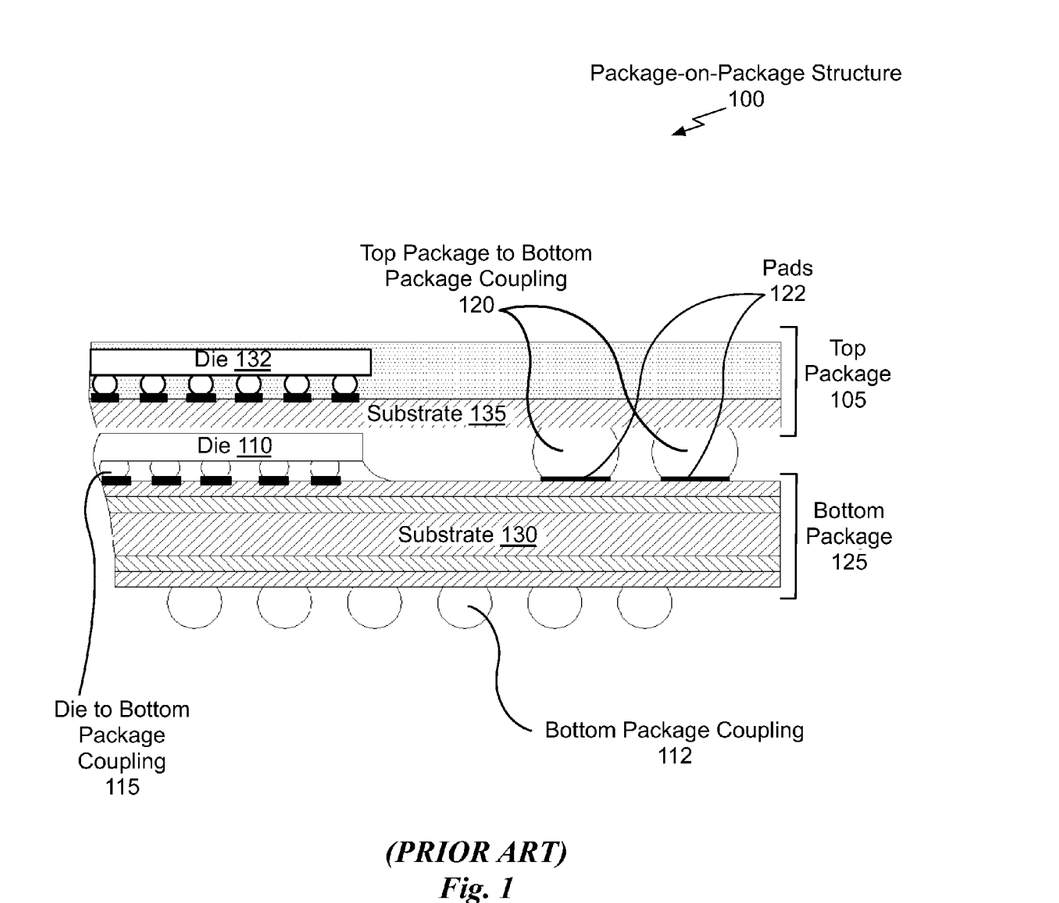
FIG. 1 illustrates a prior art PoP structure.

A conventional package-on-package (PoP) structure provides an integrated circuit die coupled to a memory device using a bottom package that contains the integrated circuit die and a top package that contains one or more memory die. FIG. 1 illustrates a prior art PoP structure 100. A packaged integrated circuit die 110 may be mounted on top of a bottom package 125 using a flip-chip (i.e., controlled collapse chip connection) configuration so that solder balls provide a die to bottom package coupling 115. The bottom package 125 includes a bottom package coupling 112 (e.g., solder balls, bumps, dots, etc.) to couple the bottom package 125 portion of the PoP structure to a printed circuit board or other system substrate. The bottom package 125 and the top package 105 each include a substrate 130 and 135, respectively that provides a stiff layer on which additional insulating and conductive layers may be applied. The substrates 130 and 135 are typically implemented using a fiber-based material to provide a rigid structure. The substrate 135 may be 2 or more layers to accommodate routing from the top package to bottom package coupling 120 to a packaged integrated circuit die 132 that is mounted on the substrate 135 using a flip-chip configuration so that solder balls coupled the packaged integrated circuit die 132 to the substrate 135.

The bottom package 125 includes pads 122 on the top of the bottom package 125 that are coupled to a top package 105 by a top package to bottom package coupling 120 (e.g., solder balls). The solder balls that provide the top package to bottom package coupling 120 need to be sized to meet a clearance requirement between the bottom package 125 and the top package 105. Specifically, the top package 105 should not contact the die 110. The solder balls should also be positioned far enough apart from each other so that electrical shorts do not occur between adjacent solder balls. Therefore, as the clearance requirement increases, the size of the solder balls increase and the pitch between the top package to bottom package coupling 120 also increases. As the pitch increases, the number of separate electrical connections provided by the top package to bottom package coupling 120 for a PoP structure decreases. Typically, due to the clearance requirement, two rows of solder balls are used to couple the bottom package 125 to the top package 105, as shown in FIG. 1. A typical size for one of the solder balls in the top package to bottom package coupling 120 is 200 microns in diameter.

As the size of the solder balls increases, the reliability of the package-on-package structure 100 decreases due to solider ball collapse. More recently, PoP structures have been constructed using copper (Cu) cored solder balls. Because the copper cored solder halls are not susceptible to collapse, the pitch of the solder balls may be reduced compared with using conventional solder balls. Reducing the pitch of the copper cored solder halls may allow for the inclusion of a third row of pads and copper cored solder balls, thereby increasing the number of connections between the top package 105 and the bottom package 125. However, as memory bandwidth requirements continue to increase, even more connections between the top package 105 and the bottom package 125 are needed. Thus, there is a need for addressing these issues and/or other issues associated with the prior art.

SUMMARY

A system, method, and computer program product are provided for producing a high bandwidth bottom package of a die-on-package structure. The method includes the steps of receiving a bottom package comprising a substrate material having a top layer and an integrated circuit die that is coupled to the top layer of the substrate material. A first set of pads is formed on the top layer of the substrate material and a layer of dielectric material is applied on a top surface of the bottom package to cover the integrated circuit die and the first set of pads.

DETAILED DESCRIPTION

A technique for preparing a high bandwidth bottom package for use within a die-on-package (DoP) structure has different processing steps compared with producing the conventional bottom package 125. The high bandwidth bottom package enables a smaller pitch between separate couplings between a device that is combined with a high bandwidth bottom package to form a DoP structure compared with the bottom package 125, thereby enabling a greater number of separate electrical connections between the high bandwidth bottom package and the device. Anonconductive dielectric material is laminated to a top layer of a substrate material, covering an integrated circuit die that is mounted on the high bandwidth bottom package and also covering pads located on a top layer of the high bandwidth bottom package. The overall height of a DoP package structure using the high bandwidth bottom package may be reduced compared with a conventional PoP package structure 100 using the bottom package 125 comprising the substrate 130 and the top package 105 comprising the substrate 135.

Figure 2:
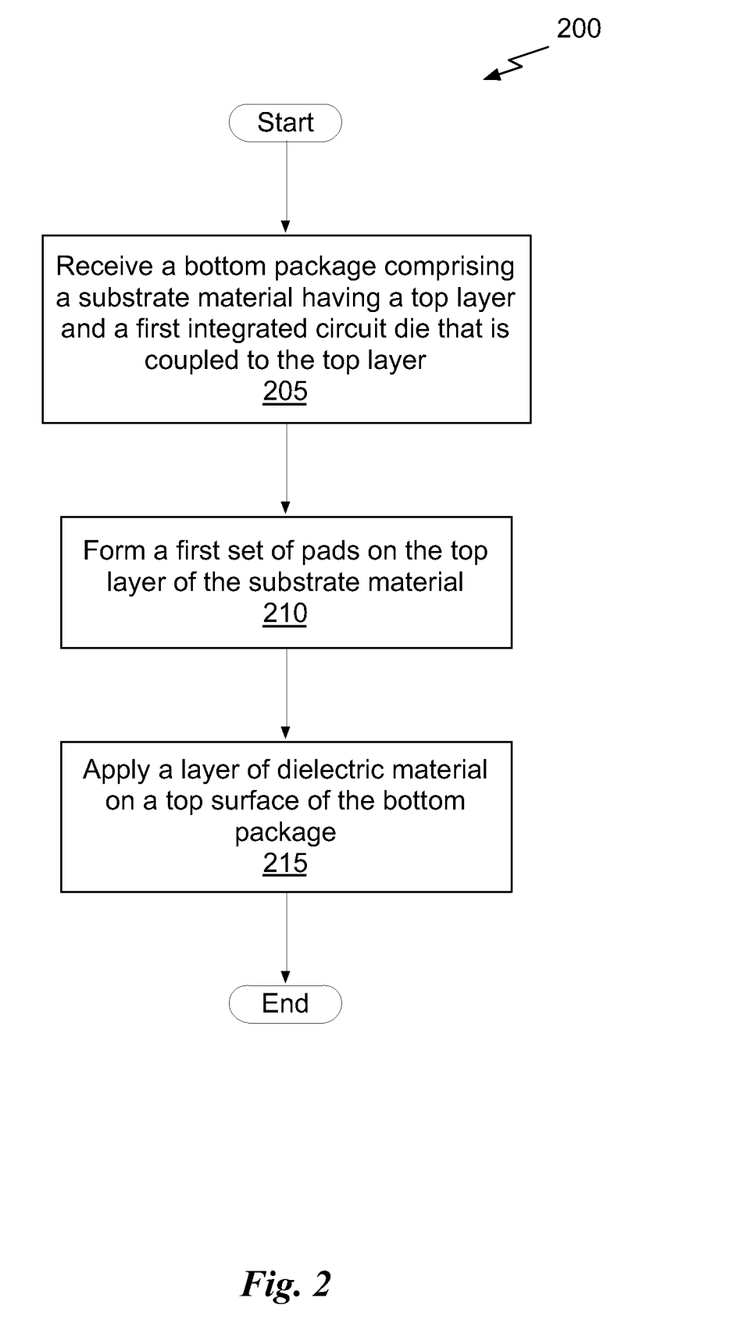
FIG. 2 illustrates a flowchart of a method for preparing a high bandwidth bottom package for use within a PoP structure, in accordance with one embodiment.

FIG. 2 illustrates a flowchart of a method 200 for preparing a high bandwidth bottom package for use within a PoP structure, in accordance with one embodiment. Although method 200 is described in the context of certain circuit and system implementations described in FIGS. 3A, 3B, 3C, 3D, 4A, 4B, and 6, the method 200 may also be performed by a software program, other custom circuitry, or by a combination of custom circuitry and a software program. Furthermore, persons of ordinary skill in the art will understand that any system that performs method 200 is within the scope and spirit of embodiments of the present invention.

At step 205, a bottom package comprising a substrate material having a top layer and an integrated circuit die that is coupled to the top layer is received. In the context of the present description, the substrate material is a dielectric material. Example substrate materials include ABF (Ajinomoto build-up films). Pre-preg material (e.g., Bismaleimide/Triazine (BT)). In the context of the following description prepreg is used as a term for "pre-impregnated" composite fibers where a matrix material, such as epoxy, is already present. The integrated circuit die may comprise one or more silicon based integrated circuits (e.g., a central processing unit (CPU), a graphics processing unit (GPU), a memory unit, etc.). In one embodiment, the integrated circuit die is implemented so that the pads of the integrated circuit die are electrically coupled to a corresponding set of pads on the top layer of the substrate material using a flip-chip process.

At step 210, a first set of pads is formed on the top layer of the substrate material. One or more pads of the integrated circuit die are electrically coupled through routing to the first set of pads. In the context of the present description, the first set of pads may each include an area on the top layer of the substrate material to be electrically connected with a corresponding area of a pad in the second set of pads during a fabrication or assembly process. In the context of the present description, the pads may be made of a conductive material, such as metal (e.g., copper). In one embodiment, the pads in the first set of pads may be affixed to the top layer of the substrate material by printing the pads, silk-screening the pads, laminating the pads, etc.

At step 215, a layer of dielectric material is applied on a top surface of the bottom package to cover the integrated circuit die and the first set of pads. In one embodiment, the dielectric material is a build-up material. In one embodiment, the dielectric material is a prepreg material (i.e., fiberglass material impregnated with resin) or an anjinomoto build-up film (ABF) material. In one embodiment, the dielectric material is the same as the substrate material or is otherwise compatible with the substrate material. In one embodiment, a coefficient of thermal expansion of the dielectric material substantially matches (i.e., is within 5% compared with) a coefficient of thermal expansion of the substrate material. In one embodiment, the dielectric material is a high modular material that is substantially rigid.

In one embodiment, the high bandwidth bottom package may include a ball grid array on a surface of the high bandwidth bottom package opposing the top layer of the substrate. For example, a plurality of solder balls may be coupled to a bottom surface of the high bandwidth bottom package (e.g., utilizing flux, etc.).

The first set of pads may be electrically coupled to a second set of pads by holes through the dielectric material that are filled with conductive material to provide conductive paths through the layer of the dielectric material. In one embodiment, the first set of pads are configured to be electrically coupled to routing paths on a top surface of the layer of the dielectric material through the filled holes. In one embodiment, the holes are produced by mechanical drilling. In one embodiment, a cross-sectional dimensional of each hole of the holes is less than or equal to 400 um microns. The routing paths may be electrically coupled to the second set of pads.

In one embodiment, a second layer of the dielectric material is applied to cover the dielectric material and the second set of pads is formed on top of the second layer of the dielectric material. In one embodiment, a bare integrated circuit die may be electrically coupled to the second set of pads to form a DoP structure. The bare integrated circuit die may comprise a memory. In one embodiment, the high bandwidth bottom package is coupled to a device to form a DoP structure, and the device may include one or more integrated circuit die combined vertically (e.g., stacked, etc.), where one die is stacked on top of another die.

In the context of the present description, the second set of pads may each include an area on the top layer of the second layer of the dielectric to be electrically connected with a corresponding area of a pad of a bare integrated circuit die during the assembly process to form a die-on-package (DoP) structure. The bare integrated circuit die may be mounted to the second set of pads using an adhesive flip-chip configuration so that a film (e.g., anisotropic conductive film) or adhesive (e.g., anisotropic conductive adhesive) provides an electrical coupling between pads on the bare integrated circuit die to the second set of pads to provide a finer pitch compared with conventional solder ball flip-chip configurations. In one embodiment, the pads in the second set of pads may be affixed to the top layer of the second layer of the dielectric material by printing the pads, silk-screening the pads, laminating the pads, etc.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 3A:
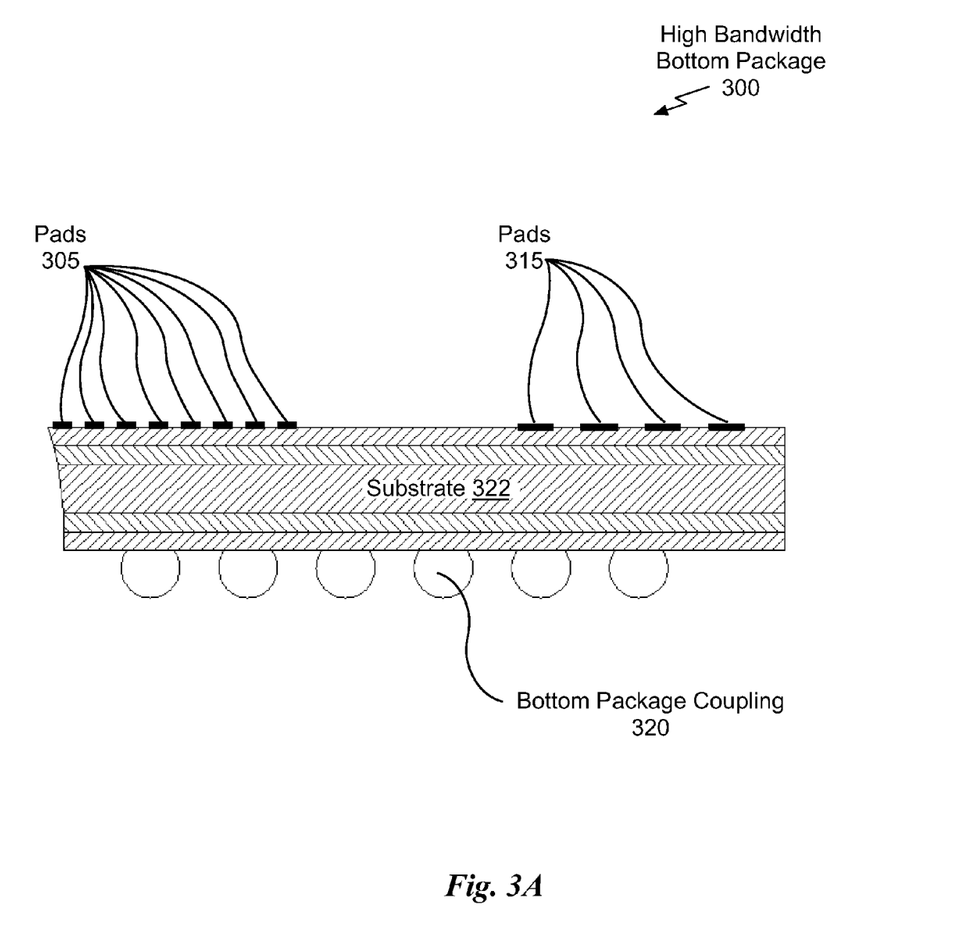
FIG. 3A illustrates a high bandwidth bottom package, in accordance with one embodiment.

FIG. 3A illustrates a high bandwidth bottom package 300, in accordance with one embodiment. The bottom package 300 comprises a substrate material 322, pads 305, and pads 315. The bottom package 300 may also comprise a bottom package coupling 320 (e.g., solder balls, bumps, dots, etc.) that is configured to couple the bottom package 300 to a printed circuit board or other system substrate. The pads 305 are configured to be electrically coupled to a packaged integrated circuit die. The pads 315 are configured to be electrically coupled to a bare integrated circuit die through one or more layers of a dielectric material. In general, the pitch (e.g., spacing along the surface of a top layer of the substrate 322) of the pads 305 is finer compared with the pitch of the pads 315. A pitch of the pads 315 may also be finer compared with the pitch of the conventional pads 122 and top package to bottom package coupling 120 in the PoP structure 100 shown in FIG. 1. Therefore, the pads 315 may provide a higher number of connections to the high bandwidth bottom package 300 compared with the conventional pads 122 of the bottom package 125 shown in FIG. 1.

Figure 3B:
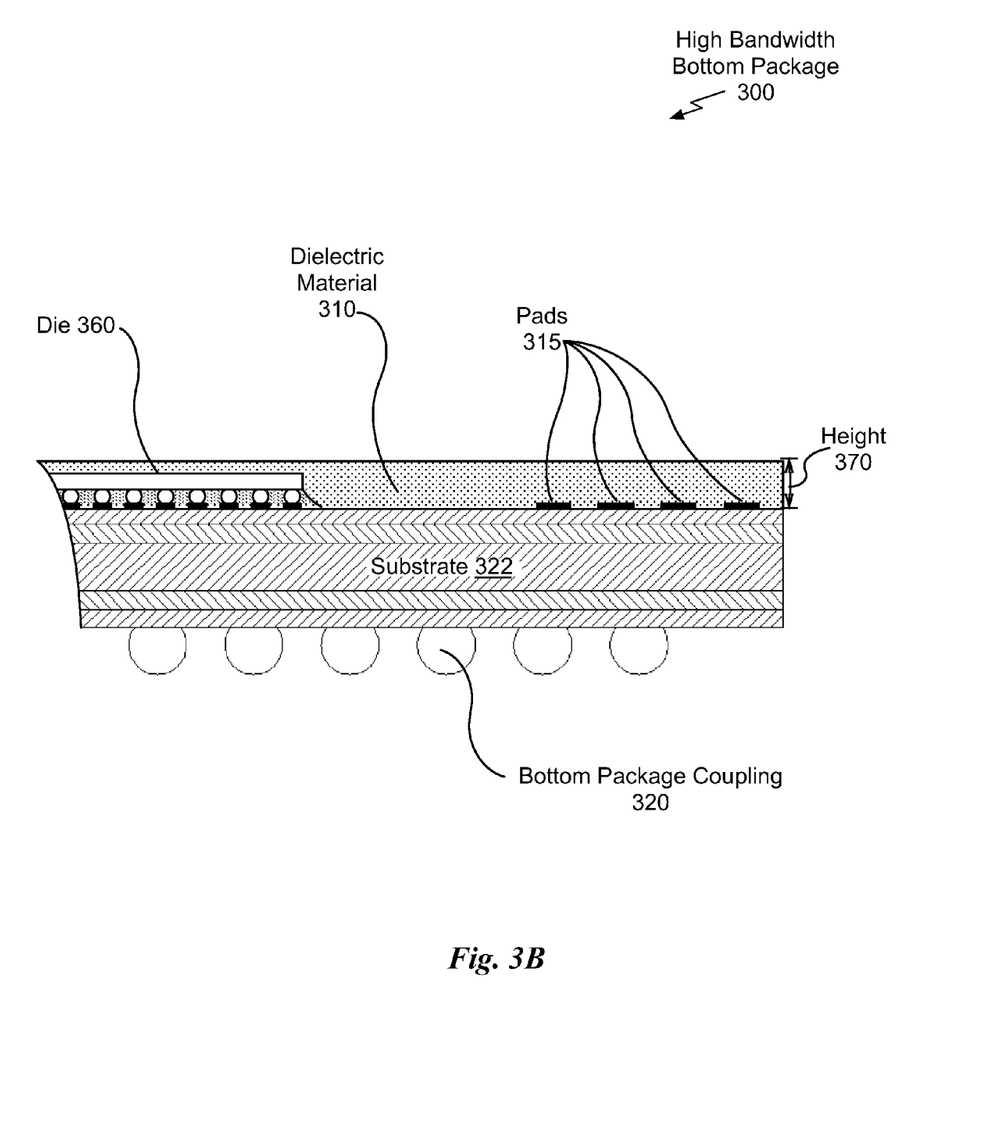
FIG. 3B illustrates the high bandwidth bottom package of FIG. 3A after an integrated circuit die is mounted onto the high bandwidth bottom package and a dielectric material is applied to cover the high bandwidth bottom package, in accordance with one embodiment.

FIG. 3B illustrates the high bandwidth bottom package 300 of FIG. 3A after an integrated circuit die 360 is mounted onto the high bandwidth bottom package 300 and a dielectric material 310 is applied to cover the high bandwidth bottom package 300, in accordance one embodiment. A layer of the dielectric material 310 is applied to the top layer of the substrate material 322 to cover the top surface of the substrate material 322, the integrated circuit die 360, and the pads 315. In one embodiment, the layer of the dielectric material 310 is laminated to the top surface of the substrate material 322.

In one embodiment, the dielectric material 310 is ABF or a bismaleimide triazine (BT) material, such as prepreg. In one embodiment, the dielectric material 310 is the same material as the substrate material 322 or is otherwise compatible with the substrate material 322. Using the same material may reduce warpage of the high bandwidth bottom package 300. In another embodiment, the dielectric material 310 has a coefficient of thermal expansion that substantially matches (i.e., is within 5% compared with) a coefficient of thermal expansion of the substrate material 322. Using materials having substantially equal coefficients of thermal expansion may reduce warpage of the high bandwidth bottom package 300. In one embodiment, the dielectric material 310 is a high modular material that is substantially rigid to reduce warpage of the high bandwidth bottom package 300.

In one embodiment, the integrated circuit die 360 is packaged (as shown in FIG. 3B) and in other embodiments, the integrated circuit die 360 is unpackaged (i.e., is a bare die). In one embodiment, a height 370 of the dielectric material 310 may be determined to be greater than the height of the integrated circuit die 360 when the integrated circuit die 360 is coupled to the pads 305 so that the dielectric material 310 covers a top surface of the integrated circuit die 360.

Figure 3C:
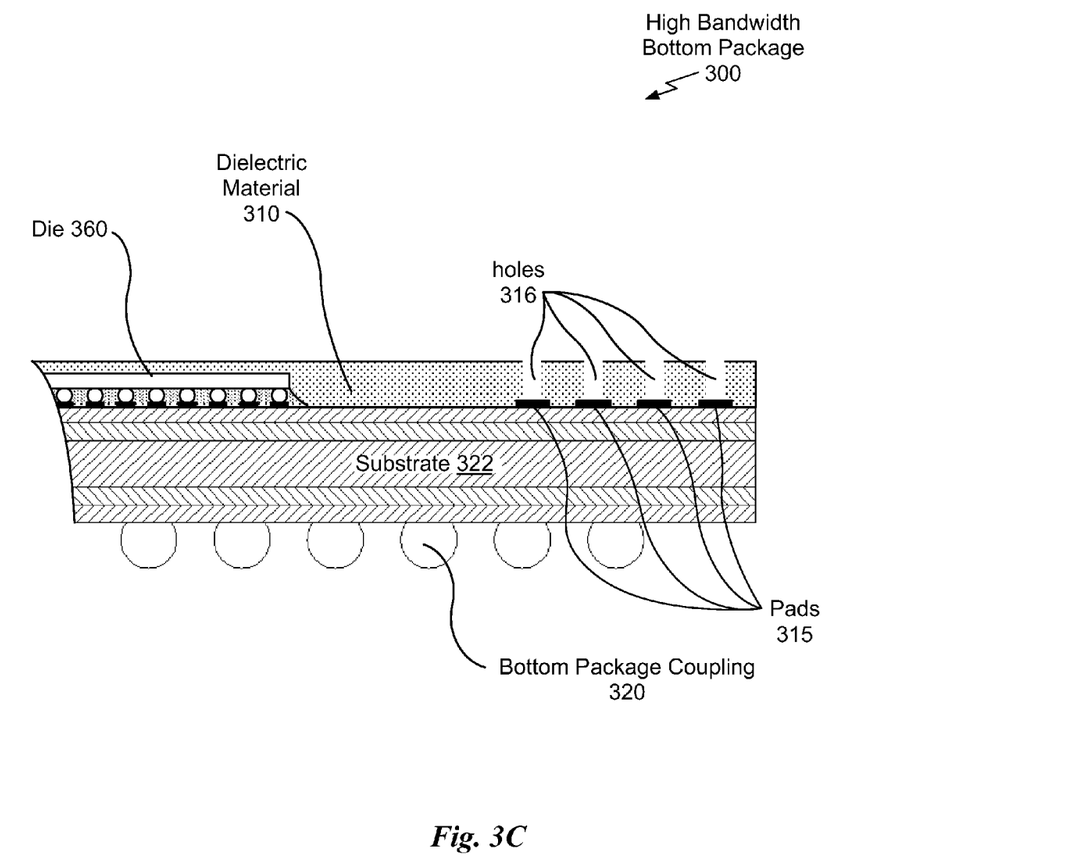
FIG. 3C illustrates the high bandwidth bottom package of FIG. 3B after holes are formed through the dielectric material, in accordance with one embodiment.

FIG. 3C illustrates the high bandwidth bottom package 300 of FIG. 3B after holes 316 are formed through the dielectric material 310, in accordance with one embodiment. A hole may be formed at each of the pads 315 to expose the pads 315. In one embodiment, portions of the dielectric material 310 may be removed by laser cutting, laser drilling, or mechanical drilling, to form the holes 316. In one embodiment, each hole of the holes 316 is 100 um to 300 um microns in diameter.

Figure 3D:
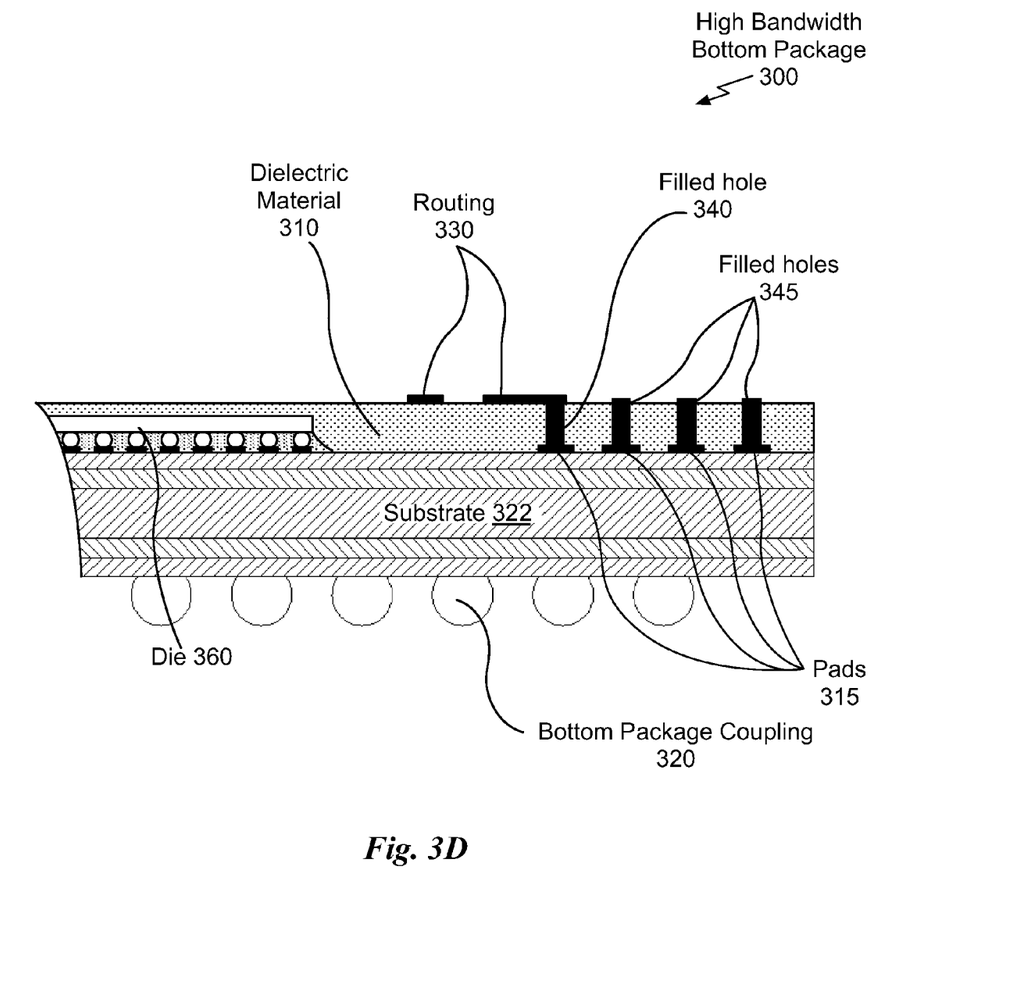
FIG. 3D illustrates the high bandwidth bottom package of FIG. 3C after the holes are filled with a conductive material, in accordance with one embodiment.

FIG. 3D illustrates the high bandwidth bottom package 300 of FIG. 3C after the holes 316 are filled with a conductive material, in accordance with one embodiment. The holes 316 may be filled with conductive material e.g., copper) to produce the filled holes 340 and 345. Conductive traces (i.e., routing paths) for routing 330 are formed on the top surface of the layer of the dielectric material 310. The filled holes 340 and 345 electrically couple the pads 315 to the routing 330. As shown in FIG. 3D, the filled hole 340 is coupled to a trace of the routing 330. The filled holes 345 may also be coupled to routing paths (not shown) or pads formed on the top surface of the one or more dielectric layers.

Figure 4A:
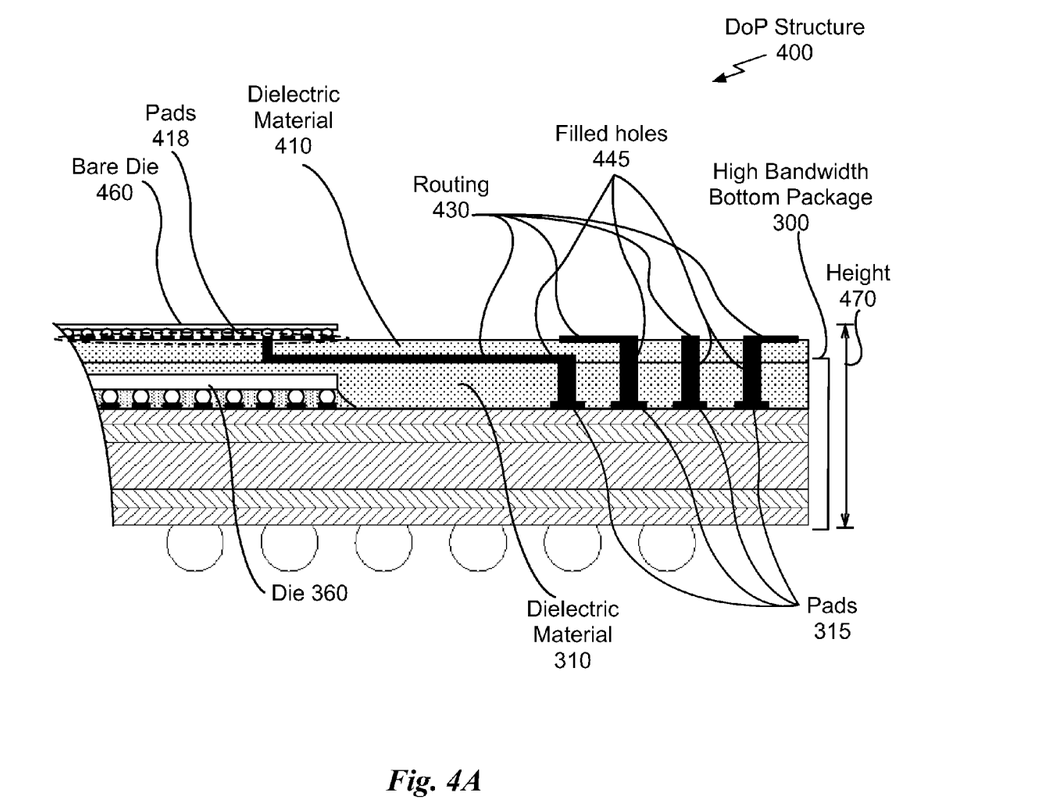
FIG. 4A illustrates the high bandwidth bottom package of FIG. 3D coupled to a bare integrated circuit die to form a die-on-package (DoP) structure, in accordance with one embodiment.

FIG. 4A illustrates the high bandwidth bottom package 300 of FIG. 3D coupled to a second integrated circuit die to form a DoP structure 400, in accordance with one embodiment. One or more additional layers of the dielectric material, such as a layer of dielectric material 410 may be applied to the high bandwidth bottom package 300 to provide additional routing 430 between the first set of pads 315 and a second set of pads 418 on the top layer of the dielectric material 410 that are electrically coupled to pads of a bare integrated circuit die 460. In one embodiment (not shown), only one layer of the dielectric material is applied to the high bandwidth bottom package 300 (i.e., the dielectrical material 310) and the bare integrated circuit die 460 is mounted on top of the one layer of the dielectric material.

In contrast with a conventional bottom package of the PoP structure 100, as shown in FIG. 1, solder balls are not formed at the pads 315. Instead, routing 330 is formed on the top surface of the layer of the dielectric material 310 and routing 430 is formed on the top surface of the layer of the dielectric material 410 and the second set of pads 418 are coupled to the first set of pads 315 by the filled holes 445. The diameter of the filled holes 445 may be substantially less compared with a conventional solder ball such as a solder ball or a copper cored solder ball comprising the top package to bottom package coupling 120 shown in FIG. 1. Therefore, a spacing or pitch of the pads 315 may be reduced compared with a conventional bottom package, such as the pads 122 of FIG. 1. Consequently, a greater number of separate electrical connections may be provided by the high bandwidth bottom package 300 compared with a conventional bottom package, such as the bottom package 100.

In one embodiment, as shown in FIG. 4A, the DoP structure 400 includes a bare integrated circuit die 460. The bare integrated circuit die 460 may be mounted to the second set of pads 418 on the top layer of the dielectric material 410 using an adhesive flip-chip configuration or a conventional solder ball flip-chip configuration. In one embodiment, the bare integrated circuit die 460 is replaced with a packaged integrated circuit die and a pitch of the pads 418 to couple the bottom package 300 to the packaged integrated circuit die is less than or equal to 400 microns. In another embodiment, the bare integrated circuit die 460 is replaced with one or more stacked (bare or packaged) integrated circuit die (typically memory devices).

In one embodiment, the dielectric material 310 of the high bandwidth bottom package 300 and the dielectric material 410 prevent the pads of the bare die 460 from coming into contact with the integrated circuit die 360. Additionally, a height 470 of the DoP structure 400 may be reduced compared with a height the PoP structure 100 because a second substrate is not included in the DoP structure 400. A reduced height may be beneficial when the DoP structure 400 is included in handheld or compact computing devices.

Figure 4B:
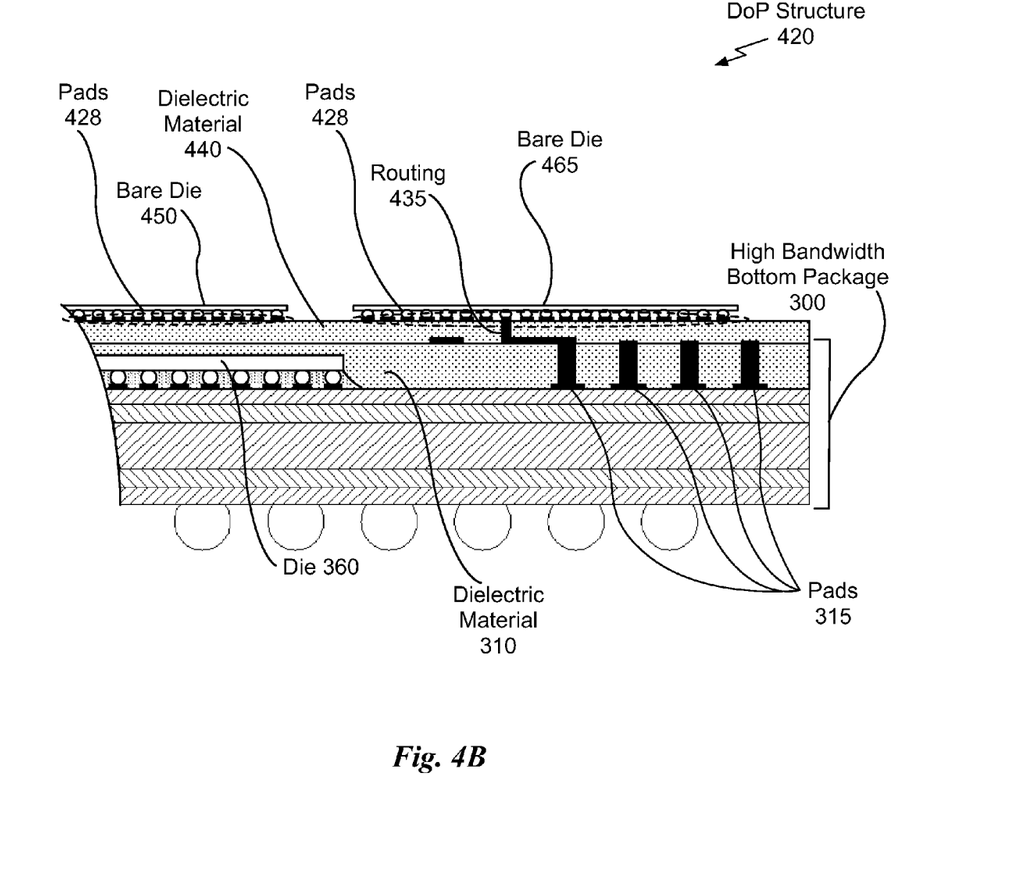
FIG. 4B illustrates the high bandwidth bottom package of FIG. 3D coupled to multiple integrated circuit die to form a DoP structure, in accordance with one embodiment.

FIG. 4B illustrates the high bandwidth bottom package 300 of FIG. 3D coupled to multiple bare integrated circuit die to form a DoP structure 420, in accordance with one embodiment. One or more additional layers of the dielectric material, such as a layer of dielectric material 440 may be applied to the high bandwidth bottom package 300 to provide additional routing paths between the first set of pads 315 and a second set of pads 428 on the top layer of the dielectric material 440 that are electrically coupled to pads of a bare integrated circuit die 450 and a bare integrated circuit die 465. For example, a routing path 435 may be provided between a first pad of the pads 315 and a pad of the bare integrated circuit die 465.

In one embodiment, as shown in FIG. 4B, the DoP structure 400 includes a bare integrated circuit die 460. The bare integrated circuit die 450 and 465 may be mounted to the second set of pads 428 on the top layer of the dielectric material 440 using an adhesive flip-chip configuration or a conventional solder ball flip-chip configuration. In one embodiment, the bare integrated circuit die 450 and/or the bare integrated circuit die 465 is replaced with a packaged integrated circuit die and a pitch of the pads 428 to couple the bottom package 300 to the packaged integrated circuit die is less than or equal to 400 microns. In another embodiment, the bare integrated circuit die 450 and/or the bare integrated circuit die 465 is replaced with one or more stacked (bare or packaged) integrated circuit die (typically memory devices).

In one embodiment, the dielectric material 310 of the high bandwidth bottom package 300 and the dielectric material 440 prevent the pads of the bare die 450 and/or the bare integrated circuit die 465 from coming into contact with the integrated circuit die 360. Additionally, a height of the DoP structure 420 may be reduced compared with a height the PoP structure 100 because a second substrate is not included in the DoP structure 420. A reduced height may be beneficial when the DoP structure 420 is included in handheld or compact computing devices.

The high bandwidth bottom package 300 has several advantages over the conventional bottom package 125. Specifically, compared with the conventional bottom package 125, the high bandwidth bottom package 300 is less likely to warp when the dielectric material 310 is a high modulus material that is stiff. Reducing warpage may result in higher assembly yields for the high bandwidth bottom package 300 and a DoP structure 400 or 420 that uses the high bandwidth bottom package 300. The stiffness of the high bandwidth bottom package 300 also eases handling during the processing and assembly steps. The overall height of the high bandwidth bottom package 300 may be reduced compared with the conventional bottom package 125 because a second substrate 135 and/or a top package 105 are not needed. Finally, because the pitch of the pads 315 is reduced, the body size of the high bandwidth bottom package 300 may be reduced compared with the body size of the conventional bottom package 125.

Compared with the PoP structure 100, the DoP structures 400 and 420 that include the high bandwidth bottom package 300 may be simpler to construct. For example, the application of the dielectric material 312 may be performed as a step during fabrication of the high bandwidth bottom package 300 and a top package is not needed. A processing step of depositing the dielectric material 310 on the substrate 322 is typically easier compared with assembling the PoP structure 100 or a similar conventional PoP structure. Additionally, the high bandwidth bottom package 300 may have better electrical performance compared with the conventional bottom package 125 because the pitch of the pads 315 may be reduced compared with the pitch of the pads 122 of the bottom package 125.

Figure 5:
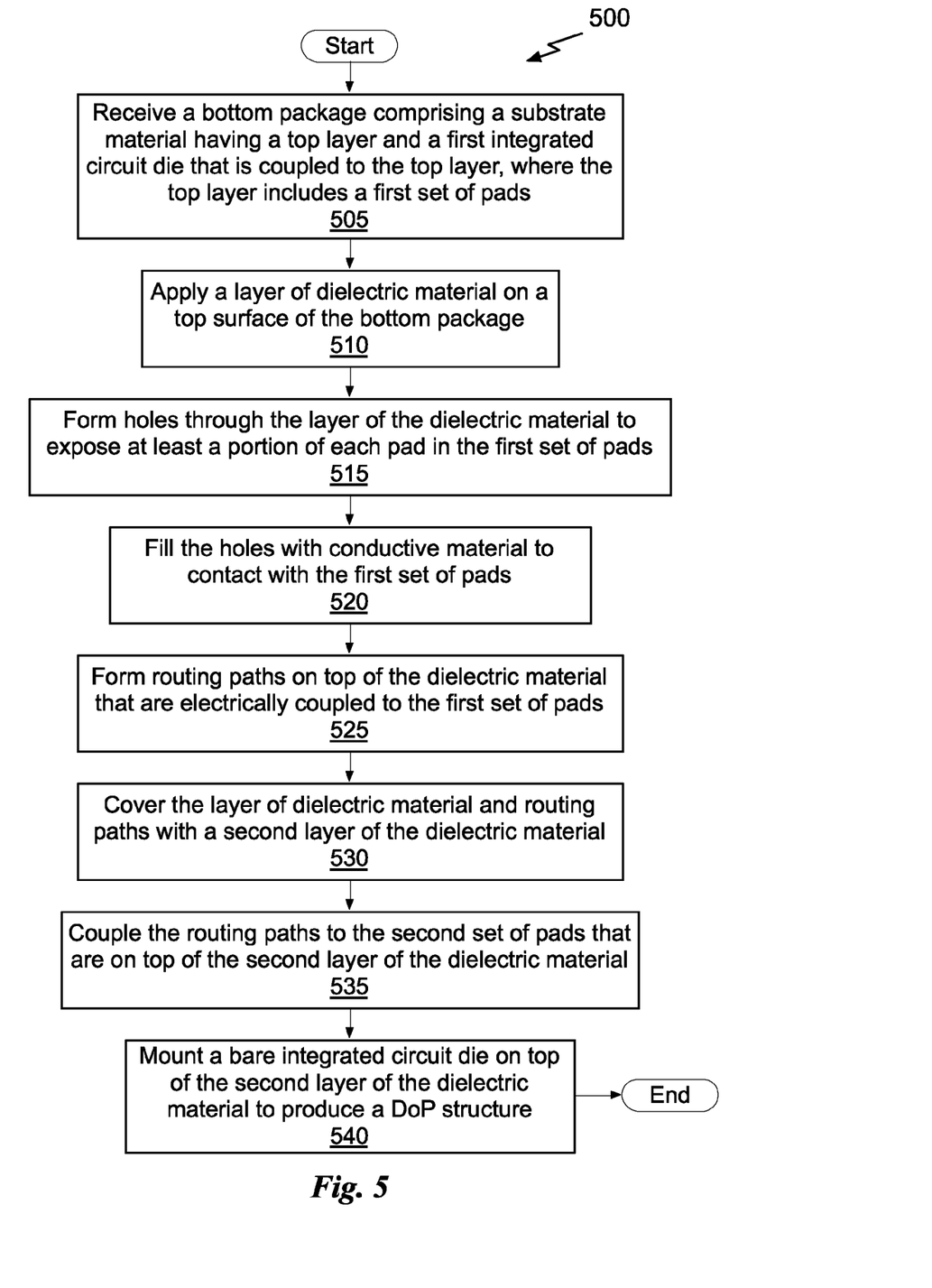
FIG. 5 illustrates a flowchart of another method for preparing a DoP structure using a high bandwidth bottom package, in accordance with one embodiment.

FIG. 5 illustrates a flowchart of a method 500 for preparing a DoP structure using a high bandwidth bottom package 300, in accordance with one embodiment. Although method 500 is described in the context of certain circuit and system implementations described in FIGS. 3A, 3B, 3C, 3D, 4A, 4B, and 6, the method 500 may also be performed by manufacturing machinery using a software program, custom circuitry, or by a combination of custom circuitry and a software program. Furthermore, persons of ordinary skill in the art will understand that any system that performs method 500 is within the scope and spirit of embodiments of the present invention.

At step 505, a bottom package 300 comprising the substrate material 322 having a top layer and an integrated circuit die 360 that is coupled to the top layer of the substrate material 322 is received. The top layer of the substrate material 322 includes a first set of pads 315 that are configured to be electrically coupled to a second set of pads 418 or 428 by holes 316 through the dielectric material 310 that are filled with conductive material. At step 510, the layer of the dielectric material 310 is applied to the top layer of the bottom package 300 to form the high bandwidth bottom package 300. The layer of dielectric material 310 covers the integrated circuit die 360 and the first set of pads 315.

At step 515, the holes 316 are formed through the layer of the dielectric material 310 to expose at least a portion of the first set of pads 315. At step 520, the holes 316 are filled with conductive material to contact with the first set of pads 315. At step 525, routing 330 is formed on top of the dielectric material 310 and the routing 330 is electrically coupled to the first set of pads 315 through the filled holes. At step 530, a second layer of the dielectric material 410 or 440 is applied to the high bandwidth bottom package 300 to cover the layer of the dielectric material 310 and the routing 330. At step 535, the routing 330 is coupled to the second set of pads 418 or 428 that are on top of the second layer of the dielectric material 410 or 440, respectively.

One or more layers of dielectric material and routing paths may be applied on top of the dielectric material 310 to provide additional routing paths between the first set of pads 315 and the second set of pads 418 or 428. At step 540, the integrated circuit die 360 is mounted on top of the layer of the dielectric material 410 or 440 to produce the DoP structure 400 or 420, respectively, so that the first set of pads 315 are electrically coupled to the second set of pads 418 or 428, respectively, by the filled holes.

Figure 6:
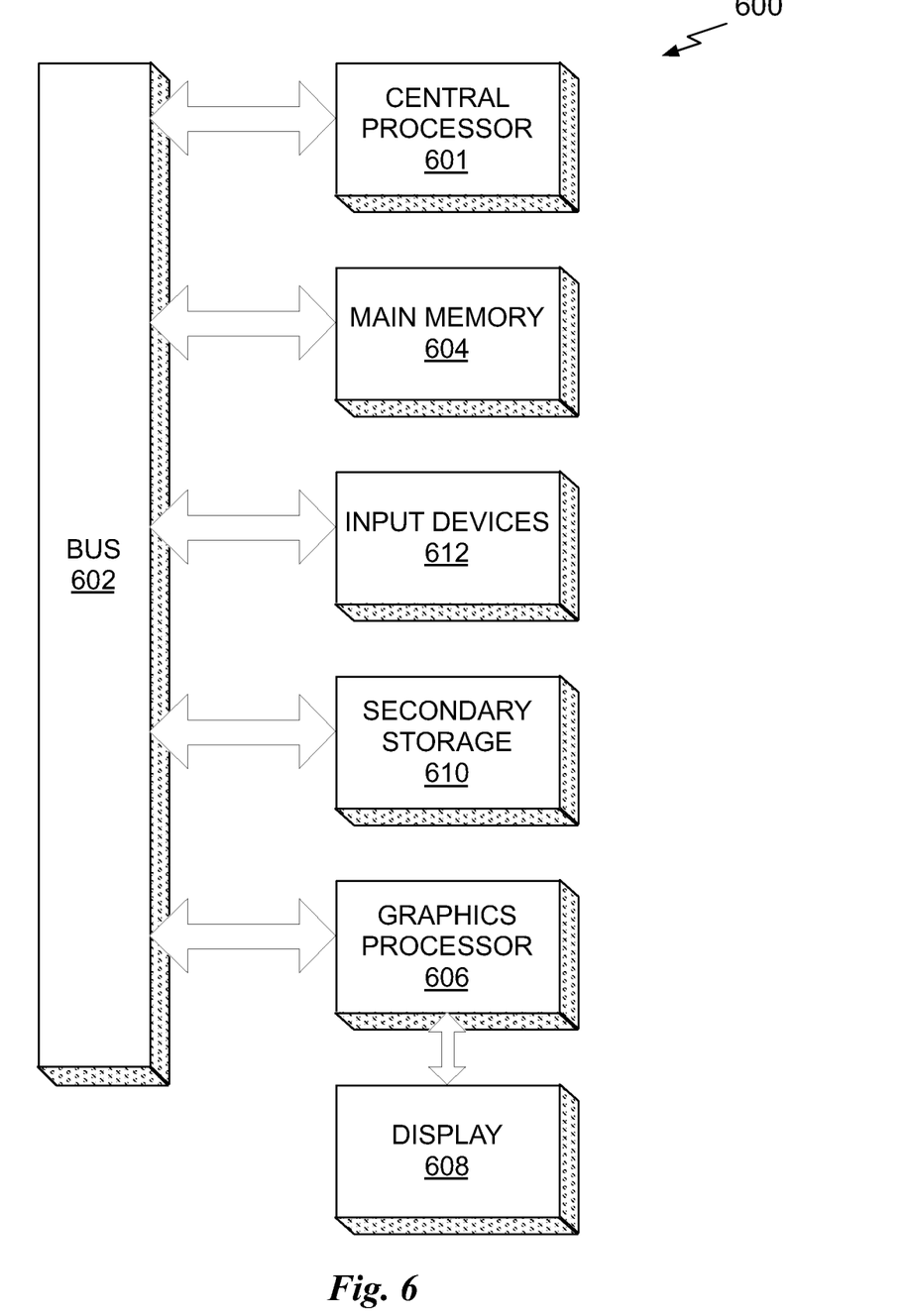
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 606, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

One or more of the central processor 601, graphics processor 606, and main memory 604 may be implemented as the integrated circuit die 360 that is included in the high bandwidth bottom package 300. One or more of the central processor 601, graphics processor 606, and main memory 604 may be implemented as the bare integrated circuit die 460 that is included in the DoP structure 400. One or more of the central processor 601, graphics processor 606, and main memory 604 may be implemented as the bare integrated circuit die 450 and/or 465 that is included in the DoP structure 420.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A bottom package, comprising:
a substrate material layer having a top surface;
a first set of pads formed on the top surface of the substrate material layer;
a second set of pads formed directly on the top surface of the substrate material layer;
an integrated circuit die that is directly coupled to the second set of pads;
a layer of dielectric material applied to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
conductive traces formed on the top surface of the layer of dielectric material.

2. The bottom package of claim 1, wherein holes are formed through the layer of the dielectric material to expose at least a portion of each pad in the first set of pads.

3. The bottom package of claim 2, wherein the holes are filled with a conductive material to contact with the first set of pads.

4. The bottom package of claim 3, wherein the conductive traces are electrically coupled to the filled holes.

5. The bottom package of claim 1, wherein a spacing between pads in the first set of pads is greater that a second spacing between pads in the second set of pads.

6. The bottom package of claim 1, wherein the layer of dielectric material comprises a high modulus material that is stiff.

7. The bottom package of claim 1, wherein the integrated circuit die is mounted onto the second set of pads using a flip-chip configuration with an adhesive layer electrically coupling the second set of pads to a third set of pads on the integrated circuit die.

8. The bottom package of claim 1, wherein each pad in the first set of pads is located outside of a space between the integrated circuit die and the top surface of the substrate material layer.

9. The bottom package of claim 1, wherein a first conductive trace of the conductive traces provides a routing path between a first pad of the first set of pads and a pad of a bare integrated circuit die.

10. A bottom package, comprising:
a substrate material layer having a top surface;
an integrated circuit die that is coupled to the top surface of the substrate material layer;
a first set of pads formed on the top surface of the substrate material layer, wherein each pad in the first set of pads is located outside of a space between the integrated circuit die and the top surface of the substrate material layer;
a layer of dielectric material applied to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
conductive traces formed on the top surface of the layer of dielectric material.

11. The bottom package of claim 10, wherein holes are formed through the layer of the dielectric material to expose at least a portion of each pad in the first set of pads.

12. The bottom package of claim 11, wherein the holes are filled with a conductive material to contact with the first set of pads.

13. The bottom package of claim 12, wherein the conductive traces are electrically coupled to the filled holes.

14. The bottom package of claim 10, further comprising a second set of pads formed on the top surface of the substrate material layer between the integrated circuit die and the top surface of the substrate material layer, wherein a spacing between pads in the first set of pads is greater that a second spacing between pads in the second set of pads.

15. The bottom package of claim 10, further comprising a second set of pads formed on the top surface of the substrate material layer between the integrated circuit die and the top surface of the substrate material layer, wherein the integrated circuit die is mounted onto the second set of pads using a flip-chip configuration with an adhesive layer electrically coupling the second set of pads to a third set of pads on the integrated circuit die.

16. A bottom package, comprising:
a substrate material layer having a top surface;
an integrated circuit die that is coupled to the top surface of the substrate material layer;
a first set of pads formed on the top surface of the substrate material layer;
a layer of dielectric material applied to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
conductive traces formed on the top surface of the layer of dielectric material, wherein a first conductive trace of the conductive traces provides a routing path between a first pad of the first set of pads and a pad of a bare integrated circuit die.

17. The bottom package of claim 16, wherein holes are formed through the layer of the dielectric material to expose at least a portion of each pad in the first set of pads.

18. The bottom package of claim 17, wherein the holes are filled with a conductive material to contact with the first set of pads.

19. The bottom package of claim 16, further comprising a second set of pads formed on the top surface of the substrate material layer between the integrated circuit die and the top surface of the substrate material layer, wherein a spacing between pads in the first set of pads is greater that a second spacing between pads in the second set of pads.

20. The bottom package of claim 16, further comprising a second set of pads formed on the top surface of the substrate material layer between the integrated circuit die and the top surface of the substrate material layer, wherein the integrated circuit die is mounted onto the second set of pads using a flip-chip configuration with an adhesive layer electrically coupling the second set of pads to a third set of pads on the integrated circuit die.

21. A method, comprising:
receiving a bottom package comprising a substrate material layer having a top surface and an integrated circuit die that is coupled to the top surface of the substrate material layer;
forming a first set of pads on the top surface of the substrate material layer, wherein each pad in the first set of pads is located outside of a space between the integrated circuit die and the top surface of the substrate material layer;
applying a layer of dielectric material to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
forming conductive traces on the top surface of the layer of dielectric material.

22. The method of claim 21, further comprising forming holes through the layer of the dielectric material to expose at least a portion of each pad in the first set of pads.

23. The method of claim 22, further comprising filling the holes with a conductive material to contact with the first set of pads.

24. The method of claim 23, wherein the conductive traces are electrically coupled to the filled holes.

25. The method of claim 24, further comprising applying a second layer of the dielectric material to cover the layer of dielectric material and the conductive traces.

26. The method of claim 25, further comprising mounting a second integrated circuit die on top of the second layer of the dielectric material to produce a die-on-package structure.

27. The method of claim 26, wherein the second integrated circuit die is a bare integrated circuit die having pads that are electrically coupled to a second set of pads that are formed on top of the second layer of the dielectric material and electrically coupled to the conductive traces.

28. A method, comprising:
receiving a bottom package comprising a substrate material layer having a top surface and an integrated circuit die that is coupled to the top surface of the substrate material layer;
forming a first set of pads on the top surface of the substrate material layer;
applying a layer of dielectric material to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
forming conductive traces on the top surface of the layer of dielectric material, wherein a first conductive trace of the conductive traces provides a routing path between a first pad of the first set of pads and a pad of a bare integrated circuit die.

29. A method, comprising:
receiving a bottom package comprising a substrate material layer having a top surface;
forming a first set of pads on the top surface of the substrate material layer;
forming a second set of pads formed directly on the top surface of the substrate material layer;
directly coupling an integrated circuit die to the second set of pads;
applying a layer of dielectric material to the top surface of the substrate material layer to cover the integrated circuit die and the first set of pads, wherein a first coefficient of thermal expansion along a top surface of the layer of dielectric material is within 5% of a second coefficient of thermal expansion along the top surface of the of the substrate material layer; and
forming conductive traces on the top surface of the layer of dielectric material.

* * * * *